United States Patent
Takezawa et al.

(10) Patent No.: US 9,795,067 B2
(45) Date of Patent: Oct. 17, 2017

(54) ELECTRONIC APPARATUS

(71) Applicant: Mitsubishi Electric Corporation, Tokyo (JP)

(72) Inventors: Ryuichi Takezawa, Tokyo (JP); Kumi Aoki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/300,319

(22) PCT Filed: Apr. 3, 2015

(86) PCT No.: PCT/JP2015/060658
§ 371 (c)(1),
(2) Date: Sep. 29, 2016

(87) PCT Pub. No.: WO2016/157534
PCT Pub. Date: Oct. 6, 2016

(65) Prior Publication Data
US 2017/0188488 A1     Jun. 29, 2017

(51) Int. Cl.
H05K 7/20 (2006.01)
H02M 7/48 (2007.01)
H02M 7/00 (2006.01)

(52) U.S. Cl.
CPC ........ H05K 7/20909 (2013.01); H02M 7/003 (2013.01); H02M 7/48 (2013.01);
(Continued)

(58) Field of Classification Search
CPC ........... H05K 7/20136–7/20163; H05K 7/202; H05K 7/206–7/20609; H05K 7/209–7/20918
See application file for complete search history.

(56) References Cited

U.S. PATENT DOCUMENTS 4,884,168 A * 11/1989 August .............. H05K 7/20254
                                                                165/185
4,949,218 A *  8/1990 Blanchard .............. H05K 7/206
                                                                165/104.33
(Continued)

FOREIGN PATENT DOCUMENTS

DE     102004030675 A1 * 11/2005    ............. H05K 7/202
DE  WO 2014060528 A1 *  4/2014    ............. H05K 7/206
(Continued)

OTHER PUBLICATIONS

Japanese Notification of Reason for Refusal for JP 2016-525118 dated Jul. 12, 2016, English Translation.
(Continued)

*Primary Examiner* — Robert J Hoffberg
(74) *Attorney, Agent, or Firm* — Sughrue Mion, PLLC; Richard C. Turner

(57) ABSTRACT

An electronic apparatus includes heat generating components accommodated in a sealed housing section of a housing, an internal-side heat exchanger and an external-side heat exchanger on opposing sides of a wall of the housing, an external-side heat exchanger for heat generating components for heat exchange between the heat generating components and air outside the housing section, and an internal fan. A high-heat generating component generating the most heat contacts the inner surface and opposed to the external-side heat exchanger for heat generating components. Heat exchange between the high-heat generating component and air outside the housing section is effected via the external-side heat exchanger for heat generating components. Heat exchange between air inside the housing section and air outside the housing section is effected via the internal-side heat exchanger and the external-side heat exchanger.

7 Claims, 6 Drawing Sheets

(52) U.S. Cl.
CPC ............. *H05K 7/202* (2013.01); *H05K 7/209* (2013.01); *H05K 7/20136* (2013.01); *H05K 7/20145* (2013.01)

(56) References Cited

U.S. PATENT DOCUMENTS

| | | | | | |
|---|---|---|---|---|---|
| 5,603,376 | A | * | 2/1997 | Hendrix | F28F 3/025 165/104.34 |
| 6,082,441 | A | * | 7/2000 | Boehmer | H02B 1/56 165/129 |
| 6,149,254 | A | * | 11/2000 | Bretschneider | H05K 7/206 312/213 |
| 6,877,551 | B2 | * | 4/2005 | Stoller | H02B 1/565 165/122 |
| 7,436,660 | B2 | * | 10/2008 | Pedoeem | H04L 12/18 165/80.3 |
| 8,611,088 | B2 | * | 12/2013 | Barna | H05K 7/20918 165/104.33 |
| 9,545,037 | B2 | * | 1/2017 | Tyleshevski | H05K 7/20909 |
| 2008/0112135 | A1 | * | 5/2008 | Kleinecke | H05K 7/206 361/696 |
| 2011/0203770 | A1 | * | 8/2011 | Rowe | H05K 7/202 165/80.1 |
| 2014/0246169 | A1 | * | 9/2014 | Perrin | H05K 7/2089 165/47 |
| 2015/0022972 | A1 | * | 1/2015 | Kwon | F24F 7/007 361/690 |
| 2015/0285255 | A1 | * | 10/2015 | Tsujimoto | H02M 7/003 417/44.1 |
| 2016/0021768 | A1 | * | 1/2016 | Webster | H05K 7/206 165/80.2 |
| 2016/0270254 | A1 | * | 9/2016 | Brianese | H05K 7/202 |
| 2016/0302330 | A1 | * | 10/2016 | Hamari | H05K 7/206 |

FOREIGN PATENT DOCUMENTS

| | | | | |
|---|---|---|---|---|
| JP | 62-074392 | U | | 5/1987 |
| JP | 6-21676 | A | | 1/1994 |
| JP | 7-131174 | A | | 5/1995 |
| JP | 2000-298510 | A | | 10/2000 |
| JP | 2001-267774 | A | | 9/2001 |
| JP | 2003-258463 | A | | 9/2003 |
| JP | 2006-50742 | A | | 2/2006 |
| JP | 2007-13223 | A | | 1/2007 |
| JP | 2011-210806 | A | | 10/2011 |
| JP | 2012-190876 | A | | 10/2012 |
| JP | 2013-150380 | A | | 8/2013 |
| JP | WO 2016185613 | A1 | * | 11/2016 ............... H05K 7/20 |
| WO | 2012/077374 | A1 | | 6/2012 |

OTHER PUBLICATIONS

International Search Report for PCT/JP2015/060658 dated Jun. 30, 2015.

* cited by examiner

ELECTRONIC APPARATUS

CROSS-REFERENCE TO RELATED APPLICATIONS

This application is a National Stage of International Application No. PCT/JP2015/060658 filed Apr. 3, 2015, the contents of which are incorporated herein by reference in their entirety.

FIELD

The present invention relates to an electronic apparatus including a sealed housing structure.

BACKGROUND

Electronic apparatuses in some cases employ sealed housing structures for waterproofing and dustproofing. In the electronic apparatus including such a sealed housing structure, an effect of discharging heat from the inside of a housing to the outside of the housing decreases. Due to such a decrease in the heat-discharging effect, the internal temperature of the housing rises and the temperatures of various components accommodated in the housing also rise. The electronic apparatus needs to maintain heat generating components at temperatures lower than their allowable temperatures for ensuring the normal operation of units accommodated in the apparatus and the reliability.

In a housing for accommodating units described in Patent Literature 1, heat exchange sections are provided on the ceiling and at least one of the front, rear, left, and right side surfaces of the sealed housing that accommodates heat generating units, and a plurality of fins of the heat exchange sections are disposed inside and outside the sealed housing. A fan for agitating an atmosphere in the housing is set in the sealed housing. The side surface and the ceiling, on which the heat exchange sections are provided, are covered with an outer wall. An external air intake port is provided in a lower part of the outer wall of the side surface and an external air discharge port is provided on the outer wall of the ceiling such that gas taken in from the external air intake port is discharged from the external air discharge port provided in the outer wall of the ceiling.

CITATION LIST

Patent Literature

Patent Literature 1: Japanese Patent Application Laid-Open No. 2001-267774

SUMMARY

Technical Problem

In Patent Literature 1, the fan circulates air inside the housing to thereby effect heat exchange between the air inside the housing and the external air. Because it is necessary to have a double structure with the heat exchange sections provided on the side surface and ceiling covered with the outer wall for the heat exchange, the housing is large-sized and the cost is high.

The present invention has been achieved in view of the above problem and an object of the invention is to obtain an electronic apparatus that includes a sealed housing structure and enables components accommodated in the housing structure to keep the temperatures low.

Solution to Problem

In one aspect of the present invention, there is provided an electronic apparatus comprising: a housing including a sealable housing section; a plurality of heat generating components accommodated within the housing section; an internal-side heat exchange section disposed in contact with one inner surface of one wall of the housing configuring the housing section, the one inner surface facing the housing section; an external-side heat exchange section disposed in contact with one outer surface of the one wall in an opposed relationship with the internal-side heat exchange section, the one outer surface facing an outside of the housing section; an external-side heat exchange section for heat generating components, for heat exchange between the heat generating components and air outside the housing section; and an internal fan accommodated within the housing section, wherein the heat generating components include a high-heat generating component disposed in contact with the one inner surface in an opposed relationship with the external-side heat exchange section for heat generating components, the high-heat generating component generating a largest amount of heat among the heat generating components during an operation, the internal fan circulates air in the housing section to deliver the air to the internal-side heat exchange section, heat exchange between the high-heat generating component and the air outside the housing section is effected through the external-side heat exchange section for heat generating components, and heat exchange between the air inside the housing section and the air outside the housing section is effected through the internal-side heat exchange section and the external-side heat exchange section.

Advantageous Effects of Invention

According to the present invention, there is an effect that it is possible to obtain an electronic apparatus that includes a sealed housing structure and enables components accommodated in the housing structure to keep the temperatures low.

DESCRIPTION OF EMBODIMENTS

Power conversion apparatuses, which are electronic apparatuses, according to embodiments of the present invention are explained in detail below with reference to the drawings. It is noted that the present invention is not limited by the embodiments.

First Embodiment.

Figure 1:
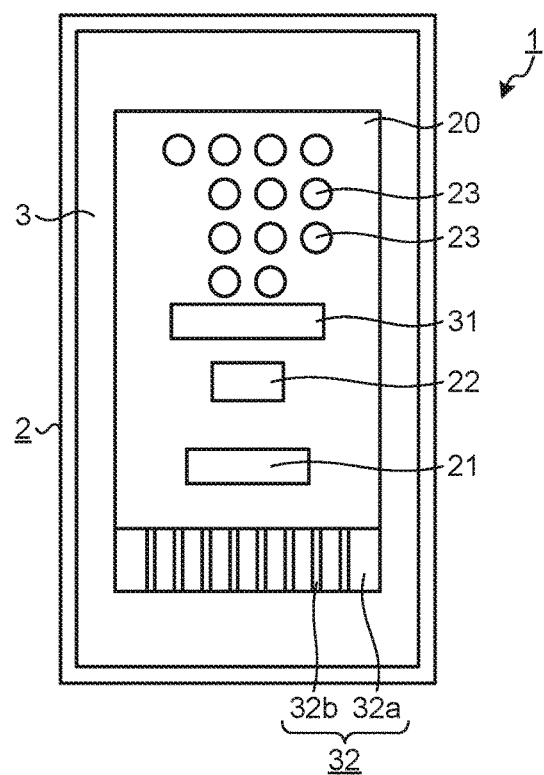
FIG. 1 is a schematic diagram illustrating a power conversion apparatus according to a first embodiment of the present invention.
Figure 2:
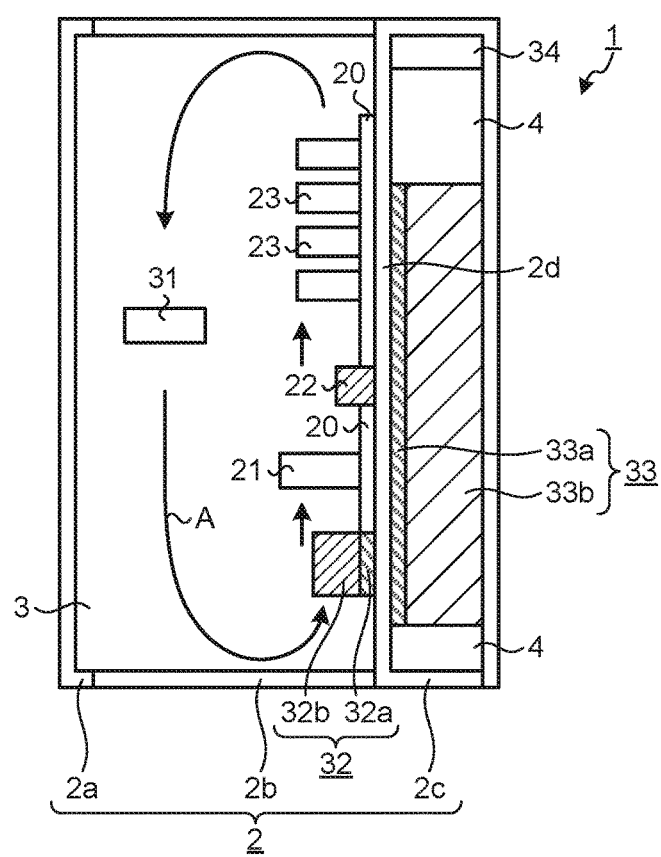
FIG. 2 is a side view of the power conversion apparatus according to the first embodiment of the present invention.

FIG. 1 is a schematic diagram illustrating a power conversion apparatus 1 according to a first embodiment of the present invention. FIG. 1 is a front view of a housing 2 accommodating electronic components configuring the power conversion apparatus 1. FIG. 1 provides an overview of main components seen through a front portion of the housing 2. FIG. 2 is a side view of the power conversion apparatus 1 according to the first embodiment of the present invention. FIG. 2 provides an overview of main components seen through a side portion configuring the housing 2. It is noted that FIG. 2, which is the side view, uses hatching for a better understanding. The same applies to the side views discussed below.

The power conversion apparatus 1 includes the housing 2 that accommodates electronic components and other components configuring the power conversion apparatus. The housing 2 is configured from a plurality of divided housing components connected to one another. The housing 2 is configured from a sheet-shaped front surface section 2a disposed on the front side, a cube-shaped rear surface section 2c having an internal space and disposed on the rear side, and a rectangle-tube-shaped body section 2b disposed between the front surface section 2a and the rear surface section 2c. The front surface section 2a, the main body section 2b, and the rear surface section 2c are formed of a metal material or a resin material having high rigidity and having weather resistance to an external environment such as wind and rain.

The front surface section 2a and the body section 2b abut on each other at their peripheral edge portions, and the peripheral edge portions have seal grooves (not shown). The peripheral edge portions of the front surface section 2a and the body section 2b are screwed together with a seal (not shown) fitting in the seal grooves. Consequently, the front surface section 2a and the body section 2b are secured together with the gap between the front surface section 2a and the main body section 2b being sealed by the seal. Similarly the body section 2b and the rear surface section 2c abut on each other at their peripheral edge portions, and the peripheral edge portions have seal grooves (not shown). The peripheral edge sections of the body section 2b and the rear surface section 2c are screwed together with a seal fitting in the seal grooves. Consequently, the body section 2b and the rear surface section 2c are secured together with the gap between the body section 2b and the rear surface section 2c being sealed by the seal. This provides a sealed housing section 3 surrounded by the front surface section 2a, the body section 2b, and the rear surface section 2c. That is, the power conversion apparatus 1 includes the waterproof housing section 3 that prevents intrusion of moisture from the outside into the housing section 3. On the other hand, the internal space of the rear surface section 2c is a heat radiating section 4 that effects heat exchange between the housing section and air. The heat radiating section 4, which discharges air out of the heat radiating section 4, is not sealed. It is noted that, in FIG. 1, structures connecting the housing components are omitted.

The seal component uses a packing or a sealing material. Although the housing 2 is configured from the front surface section 2a, the body section 2b, and the rear surface section. 2c, a manner of dividing the housing 2 is not limited to this particular division. It is only required that the sealed housing section 3 is configured from a plurality of members secured together.

The body section 2b is provided with a door for work, which is not discussed in detail. This door has a seal groove in a peripheral edge portion thereof and the body section 2b has a seal groove in a peripheral edge portion of a door-attaching part thereof. The peripheral portions are screwed together with a seal fitting the seal grooves, thus providing the sealed housing section 3.

Although the housing 2 is configured from the three divided housing components, i.e., the front surface section 2a, the main body section 2b, and the rear surface section 2c in the illustrated embodiment, the housing 2 may be configured from any other number of housing components secured together with seals fitting in seal grooves in the secured portions of the housing components from which sealed housing section 3 is configured.

The power conversion apparatus 1 includes, in the housing section 3, a power conversion circuit 11 that converts a three-phase AC voltage supplied from an AC power supply and generates a voltage required by an external load, an internal air fan 31 that circulates air in the housing section 3, and an internal-side heat exchange section 32. The internal-side heat exchange section 32, which is a heat sink for heat absorption, is provided in the housing section 3 in abutment on one inner surface of one wall 2d of the rear surface section 2c. The one wall 2d separates the housing section 3 and the heat radiating section 4, and the one inner surface of the one wall 2d faces the housing section 3. The power conversion apparatus 1 includes, in the heat radiating section 4, an external-side heat exchange section 33 and an external air fan 34 that discharges air out of the heat radiating section 4. The external-side heat exchange section 33, which is a heat sink for heat radiation, is provided in abutment on one outer surface of the one wall 2d of the rear surface section 2c. The one outer surface of the one wall 2d separating the housing section 3 and the heat radiating section 4 faces an outside of the housing section 3.

Although not shown and described, the power conversion apparatus 1 also includes other constituent members such as a control section implemented by a microcomputer having a central processing unit (CPU) mounted on an electronic circuit board for controlling the operations or constituent sections of the power conversion apparatus 1, a display device for displaying various kinds of information in the power conversion apparatus connecting wires among the constituent sections, a connector and a cable for connection to an external apparatus, and an operation board.

Figure 3:
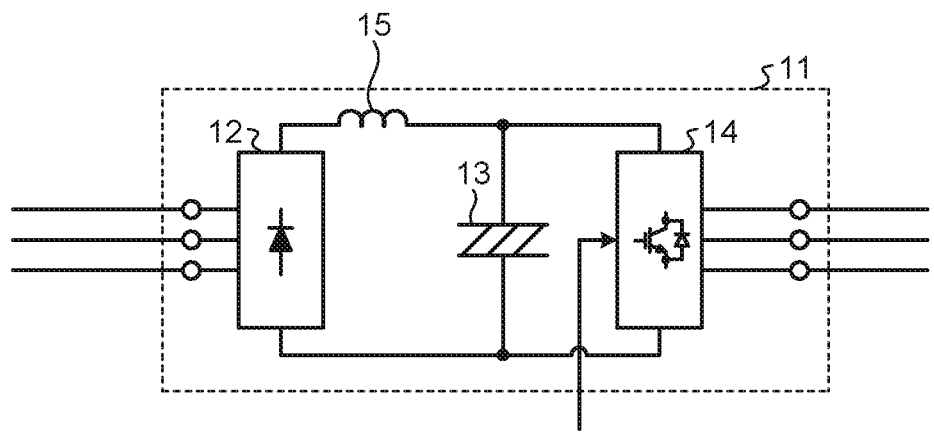
FIG. 3 is a circuit diagram illustrating the configuration of a power conversion circuit according to the first embodiment of the present invention.

FIG. 3 is a circuit diagram illustrating the power conversion circuit 11 according to the first embodiment of the present invention. The power conversion circuit 11 includes a rectifier circuit 12 that converts an AC voltage supplied from an AC power supply into a DC voltage, a smoothing circuit 13 that smooths the DC voltage from the rectifier circuit 12, and a switching circuit 14 that converts the smoothed DC voltage into a three-phase AC voltage through switching control and supplies the three-phase AC voltage to a load. The power conversion circuit 11 includes, between the rectifier circuit 12 and the smoothing circuit 13, a DC reactor 15 using a coil 21.

The rectifier circuit 12 includes rectifying diodes, which are semiconductor elements for electric power. The switching circuit 14 includes semiconductor elements for electric power such as switching semiconductor elements that switch DC power into AC power. These semiconductor elements for electric power are configured as a power module 22 stored in a package. The smoothing circuit 13 is configured using capacitors 23.

The capacitors 23 of the power conversion circuit 11, which are disposed in the housing section 3, are attached to the upper half region of the one wall 2d, which separates the housing section 3 and the heat radiating section 4, with an attachment plate 20 therebetween. The power module 22 of the power conversion circuit 11, which is disposed in the housing section 3, is attached to the lower half region of the one wall 2d, which separates the housing section 3 and the heat radiating section 4, that is, the power module 22 is attached to the region lower than the capacitors 23. The coil 21 of the power conversion circuit 11, which is disposed in the housing section 3, is attached to the lower region of the one wall 2d, which separates the housing section 3 and the heat radiating section 4, with an attachment plate 20 therebetween, that is, the coil 21 is attached to the region lower than the power module 22 with the plate 20 therebetween.

The internal-side heat exchange section 32 is disposed in a lower part of a region extending in the height direction of the power conversion apparatus 1 and facing the front surface section 2a deeply in the power conversion apparatus 1. The internal-side heat exchange section 32 includes a heat exchange section configured from a plurality of thin internal fins 32b arranged at predefined intervals in parallel on a principal plane of a flat base plate 32a. The internal-side heat exchange section 32, which is attached to the one wall 2d, includes the internal fins 32b arranged in parallel in a width direction of the power conversion apparatus 1 and extending in the height direction of the power conversion apparatus 1, and the base plate 32a set in contact with the one wall 2d. This enables air to pass through a gap between the adjacent internal fins 32b to provide a vertical airflow. It is noted that, if the internal fins 32b can be attached to the one wall 2d, the base plate 32a is unnecessary. The shape of the heat exchange section is not limited to a fin shape.

As the material of the internal-side heat exchange section 32, a metal material having high thermal conductivity such as aluminum or copper is used. The dimensions of the internal-side heat exchange section 32 are not limited to particular dimensions. However, to increase the surface area to absorb more heat of the air in the housing section 3, it is desirable to set the large dimensions of the internal-side heat exchange section 32 within an allowable range in the housing section 3. The gap between the adjacent internal fins 32b is not limited to a particular gap as long as the gap enables the vertical airflow and circulation of the internal air in the housing section 3.

The external-side heat exchange section 33, which is disposed on the one wall 2d in the heat radiating section 4, extends from the position opposed to the internal-side heat exchange section 32 to the position opposed to the capacitors 23 in the height direction of the power conversion apparatus 1. The external-side heat exchange section 33 includes a heat exchange section configured from a plurality of thin external fins 33b arranged at predefined intervals in parallel on a principal plane of a flat base plate 33a. The external-side heat exchange section 33, which is attached to the one wall 2d, includes the external fins arranged in parallel in the width direction of the power conversion apparatus 1 and extending in the height direction of the power conversion apparatus 1, and the base plate 33a set in contact with the one wall 2d. This enables air to pass through a gap region between the adjacent external fins 33b to provide a vertical airflow. It is noted that, if the external fins 33b can be attached to the one wall 2d, the base plate 33a is unnecessary. The shape of the heat exchange section is not limited to a fin shape.

As the material of the external-side heat exchange section 33, a metal material having high thermal conductivity such as aluminum or copper is used. The dimensions of the external-side heat exchange section 33 are not limited to particular dimensions. However, to increase the surface area to discharge more heat from the external fins 33b into the internal air in the heat radiating section 4, it is desirable to set the large dimensions within an allowable range in the heat radiating section 4. The gap between the adjacent external fins 33b is not limited to a particular gap as long as the gap enables the vertical airflow.

The external-side heat exchange section 33 is thermally connected to the power module 22 via the one wall 2d, which separates the housing section 3 and the heat radiating section 4. This allows the external-side heat exchange section 33 to cool the power module 22 by radiating heat of the power module 22 conducted through the one wall 2d, from the external fins 33b into the internal air in the heat radiating section 4. It is noted that the phrase "thermally connected" as used herein means a state in which the external-side heat exchange section 33 and the power module 22 are opposed to and overlap each other in the plane of the one wall 2d, the external-side heat exchange section 33 is in direct contact with the one wall 2d, and heat is transferred directly from the power module 22 via the one wall 2d. In other words, the meaning of the phrase "thermally connected" does not include a state in which the external-side heat exchange section 33 and the power module 22 do not overlap at all in the plane of the one wall 2d.

The external-side heat exchange section 33 is thermally connected to the internal-side heat exchange section 32 via the one wall 2d, which separates the housing section 3 and the heat radiating section 4. This allows the external-side heat exchange section 33 to cool the internal-side heat exchange section 32 by radiating heat of the internal-side heat exchange section 32 conducted through the one wall 2d, from the external fins 33b into the internal air in the heat radiating section 4. It is noted that the phrase "thermally connected" as used herein means a state in which the external-side heat exchange section 33 and the internal-side heat exchange section 32 are opposed to and overlap each other in the plane of the one wall 2d, the external-side heat exchange section 33 is in direct contact with the one wall 2d, and heat is transferred directly from the internal-side heat exchange section 32 via the one wall 2d. In other words, the meaning of the phrase "thermally connected" does not include a state in which the external-side heat exchange section 33 and the internal-side heat exchange section 32 do not overlap at all in the plane of the one wall 2d.

The internal air in the heat radiating section 4, which increases in temperature due to the heat radiation by the external-side heat exchange section 33, is drawn by the external air fan 34 and discharged to the outside from the upper part of the heat radiating section 4.

When the power conversion apparatus 1 is driven, the internal temperature of the housing section 3, that is, the air temperature rises due to heat generation from various heat generating components accommodated in the housing section 3. Among the components accommodated in the housing section 3, heat generating components such as the capacitors 23 and the IC chip are low-heat resistant components having relatively small heat generation. On the other hand, heat generating components such as the electronic circuit board used in the control section, a conductor for energization, and the coil 21 generate more heat and thus become high in temperature when the apparatus 1 is driven, and have high heat resistance. The power module 22 is a heat generating component that becomes high in temperature by generating the heat most among the components accommodated in the housing section 3 when the apparatus 1 is driven, and has high heat resistance.

The power conversion apparatus 1, which has the sealed housing structure, provides a low effect of discharging heat from the inside of the housing section 3 to the outside of the housing section 3. As a result, the internal temperature in the housing section 3 further rises and the temperatures of the respective heat generating components accommodated in the housing section 3 also rise. To cause the heat generating components accommodated in the housing section 3 to normally operate and ensure the reliability, it is necessary to keep the temperatures of the respective heat generating components at temperatures equal to or lower than allowable temperatures of the heat generating components.

In the power conversion apparatus 1, the external-side heat exchange section 33 thermally connected to the power module 22 via the one wall 2d separating the housing section 3 and the heat radiating section 4 radiates the heat of the power module 22 conducted through the one wall 2d, from the external fins 33b to the internal air in the heat radiating section 4. Consequently, the power module 22 that becomes high in temperature by generating the heat most among the components accommodated in the housing section 3 when the apparatus 1 is driven is efficiently cooled to thereby reduce the temperature of the power module 22, which is the largest cause of the temperature rise in the housing section 3. This reduces an amount of heat radiated from the power module 22 into the housing section 3, thus suppressing the temperature rise in the housing section 3.

In the power conversion apparatus 1, the internal-side heat exchange section 32 is exposed in the housing section 3. The internal-side heat exchange section 32 comes into contact with the internal air in the housing section 3, effect heat exchange. That is, the internal-side heat exchange section 32 absorbs heat from the internal air in the housing section 3 to thereby reduce the temperature of the internal air in the housing section 3. The internal-side heat exchange section 32 is thermally connected to the external-side heat exchange section 33 via the one wall 2d, which separates the housing section 3 and the heat radiating section 4 in the housing 2. This allows the external-side heat exchange section 33 to cool the internal-side heat exchange section 32 by radiating the heat of the internal-side heat exchange section 32 conducted through the one wall 2d, from the external fins 33b into the internal air in the heat radiating section 4. This facilitates the heat absorption from the internal air in the housing section 3 by the internal-side heat exchange section 32.

Therefore, in the power conversion apparatus 1, heat exchange is effected between the high-temperature internal air in the housing section 3 and the external air lower in temperature than the inside of the housing section 3, that is, the internal air in the heat radiating section 4 through the internal-side heat exchange section 32, the one wall 2d, which separates the housing section 3 and the heat radiating section 4 in the housing 2, and the external-side heat exchange section 33. This reduces the temperature of the internal air in the housing section 3, thus reducing the average temperature of the internal air in the housing section 3.

When heat is conducted from a surface of a heat generating component having a surface area Ac to the internal air in the housing section 3 having an air temperature Ti at a heat transfer rate Hc, the heat generating component has a temperature Tc having increased due to its heat generation in the housing section 3. Such an increased temperature Tc is represented by the following Expression (1). It is noted that the air temperature Ti in the housing section 3 and the increased temperature Tc of the heat generating component are average temperatures. ΔTc represents an increase in temperature of the heat generating component from the air temperature Ti in the housing section 3. Qall represents a total heat generation amount in the housing section 3. When an external temperature, which is a temperature outside the housing section 3, is represented as Ta, Ti>Ta. The internal air in the housing section 3 having the air temperature Ti flows to the outside having the external temperature Ta through a wall of the housing section 3 to be naturally cooled at a heat transfer rate Ha from the surface of the housing section 3 having an area Aa. The air temperature Ti in the housing section 3 is a value determined by a balance of the total heat generation amount Qall in the housing section 3 to be naturally cooled from the area of the housing section 3 with respect to the outside of the housing section 3 having the external temperature Ta.

$$Tc = Ti + \Delta Tc = Ti + Qall/(Hc \times Ac) \quad (1)$$

When the power conversion apparatus 1 does not include the internal-side heat exchange section 32, the heat of the internal air in the housing section 3 is conducted from a region where the base plate 32a of the internal-side heat exchange section 32 would abut on the one wall 2d separating the housing section 3 and the heat radiating section 4 in the housing 2, through the one wall 2d and then radiated to the internal air in the heat radiating section 4. In this case, when the base plate 32a abuts on the one wall 2d over an area Ab if the power conversion apparatus 1 includes the internal-side heat exchange section 32, heat in the internal air having the air temperature Ti in the housing section 3 is radiated to the external air in the heat radiating section 4 having the external temperature Ta through the one wall 2d and radiated from the wall 2d having the area Ab at the heat transfer rate Ha to be naturally cooled.

For the power conversion apparatus 1, the internal-side heat exchange section 32 and the external-side heat exchange section 33 are used to effect the heat exchange between the internal air in the housing section 3 and the internal air in the heat radiating section 4 to thereby reduce the air temperature Ti in the housing section 3. Consequently, according to the relation of equation (1) described above, it is possible to reduce the increased temperature Tc of the heat generating component. That is, in the power conversion apparatus 1, the average temperature of the internal air in the housing section 3 is reduced to lower the increased temperature Tc of the heat generating component.

In the power conversion apparatus 1, the internal-slide heat exchange section 32 is exposed to the internal air in the housing section 3. The exposed area of the internal-side heat exchange section 32 in the housing 3, which is larger than the area Ab, absorbs heat from the air in the housing section 3, and an amount of heat absorbed from the internal air in the housing section 3 increases accordingly.

The internal-side heat exchange section 32 is thermally connected to the external-side heat exchange section 33. As a result, in the external-side heat exchange section 33, an area equivalent to the difference between the exposed area of the external-side heat exchange section 33 to the internal air in the heat radiating section 4 and the area Ab contributes to improvement of a heat radiation effect on the heat conducted from the internal-side heat exchange section 32. This ensures that the heat conducted from the internal-slide heat exchange section 32 is efficiently radiated to reduce the temperature of the internal air in the housing section 3.

Meantime, the external-side heat exchange section 33, which is thermally connected to the power module 22, radiates the heat of the power module 22 to the internal air in the heat radiating section 4. For this reason, not all the area equivalent to the difference between the exposed area of the external-side heat exchange section 33 to the internal air in the heat radiating section 4 and the area Ab contributes to the radiation of the heat conducted from the internal-side heat exchange section 32. Nevertheless, the heat conducted from the internal-side heat exchange section 32 can be efficiently radiated because the exposed area of the external fins 33b to the internal air in the heat radiating section 4 can be approximately ten to twenty times the area Ab, although it depends on the conditions such as the size of the external fins 33b in the set external-side heat exchange section 33 and the intervals between the external fins 33b. Thus, using the internal-side heat exchange section 32 and the external-side heat exchange section 33 ensures that the temperature of the internal air in the housing section 3 is reduced through the heat exchange between the internal air in the housing section 3 and the internal air in the heat radiating section 4, thereby reducing the average temperature of the internal area in the housing section 3, and hence the temperature of the heat generating component.

When a material having a heat transfer rate higher than the heat transfer rate of the material of the one wall 2d of the housing 2 is used as the material of the internal-side heat exchange section 32 and the external-side heat exchange section 33, it is possible to further improve the cooling effect on the internal air in the housing section 3.

The internal air in the housing section 3 is circulated by the internal air fan 31 to flow into the internal-side heat exchange section 32. The high-temperature internal air in the housing section 3 is actively brought into contact with the internal-side heat exchange section 32. Consequently, it is possible to facilitate the heat absorption by the internal-side heat exchange section 32 from the internal air in the housing section 3 to thereby facilitate the heat exchange between the internal air in the housing section 3 and the internal air in the heat radiating section 4. This results in further reduction in the temperature of the internal air in the housing section 3.

In FIG. 2, the internal air fan 31 circulates the internal air in the housing section 3 in a direction indicated by arrows A. When the internal air in the housing section 3 circulates in the direction indicated by the arrows A in FIG. 2, the high-temperature air rising in the housing section 3 can be delivered to the internal-side heat exchange section 32. This facilitates the heat absorption by the internal-side heat exchange section 32 from the internal air in the housing section 3.

Figure 4:
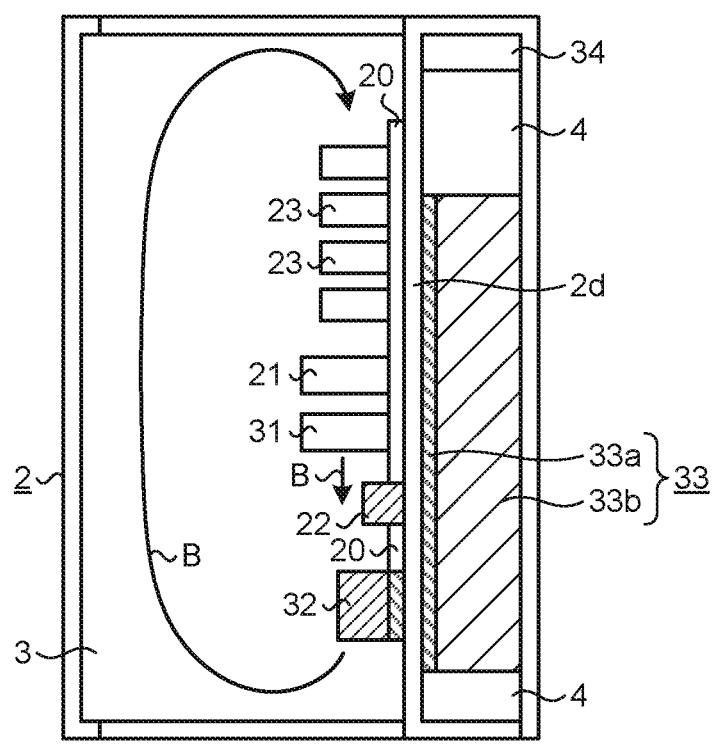
FIG. 4 is a side view illustrating another example of arrangement of members in a housing section according to the first embodiment of the present invention.

FIG. 4 is a side view illustrating another example of the arrangement or the members in the housing section 3 according to the first embodiment of the present invention. In FIG. 4, the arrangement of the members in the housing section 3 is different from the arrangement illustrated in FIG. 2. In FIG. 4, the power module 22 is disposed between the internal air fan 31 and the internal-side heat exchange section 32. The internal air fan 31 circulates the internal air in the housing section 3 in a direction indicated by arrows B in FIG. 4 and such a direction B is a direction from the power module 22 toward the internal-side heat exchange section 32. In this case, heat radiated from the power module 22 is delivered directly to the internal-side heat exchange section 32 to thereby facilitate the heat absorption by the internal-side heat exchange section 32 from the internal air in the housing section 3.

The number of internal-side heat exchange sections 32 is not limited to one. A plurality of internal-side heat exchange sections 32 can be provided. The internal-side heat exchange section 32 in the housing section 3 may be disposed at any position in the height direction on the one wall 2d, which separates the housing section 3 and the heat radiating section 4, as long as the internal-side heat exchange section 32 can be thermally connected to the external-side heat exchange section 33. When the internal-side heat exchange section 32 is disposed in the upper region in the housing section 3, the internal-side heat exchange section 32, which absorbs the heat of the high-temperature internal air rising to the upper region of the housing section 3, provides efficient heat exchange between the internal air in the housing section 3 and the internal air in the heat radiating section 4. Meantime, the heat conducted from the power module 22 is radiated from the external-side heat exchange section 33. In view of such heat radiated from the external-side heat exchange section 33, the position of the internal-side heat exchange section 32 in the height direction of the housing section 3 is preferably opposite from a direction in which the external air fan 34 discharges the internal air in the heat radiating section 4. That is, the position of the internal-side heat exchange section 32 in the height direction is preferably set on the upstream side in the discharge direction.

That is, when the internal air in the heat radiating section 4 is discharged from the upper part of the heat radiating section 4, the internal-side heat exchange section 32 is preferably provided at a lower level in the height direction of the housing section 3. When the internal air in the heat radiating section 4 is discharged from the lower part of the heat radiating section. 4, the internal-side heat exchange section 32 is preferably provided at a higher level in the height direction of the housing section 3. This enables the heat from the internal-side heat exchange section 32 to be radiated without being affected by the radiation of the heat of the power module 22 from the external-side heat exchange section 33.

A cooling structure for the internal air and the heat generating members in the housing section 3 of the power conversion apparatus 1 is simple and inexpensive to make because the cooling structure can be made by simply providing the internal-side heat exchange section 32 in the housing section 3 and thermally connecting the internal-side heat exchange section 32 to the external-side heat exchange section 33.

As explained above, according to the first embodiment, using the internal-side heat exchange section 32 and the external-side heat exchange section 33 to effect the heat exchange between the internal air in the housing section 3 and the internal air in the heat radiating section 4 reduces the temperature of the internal air in the housing section 3, thus reducing the average temperature of the internal air in the housing section and hence the temperatures of the heat generating components. The heat exchange between the power module 22 and the external-side heat exchange section 33 reduces the temperature of the power module 22 to suppress an increase in the temperature of the internal air due to the heat generation of the power module 22. Consequently, it is possible to reduce the temperatures of the heat generating components in the housing section 3 to be equal to or lower than the allowable temperatures, so that the heat generating components in the housing section 3 can normally operate. This ensures reliability of the power conversion apparatus 1. According to the first embodiment, since the external-side heat exchange section 33 is disposed on only the one wall of the housing section 3, an excessive increase in the size and the weight of the power conversion apparatus 1 and an increase in the costs of the power conversion apparatus 1 do not occur. A high-quality power conversion apparatus 1 in which a problem does not occur in even seismic resistance is obtained.

Second Embodiment.

Figure 5:
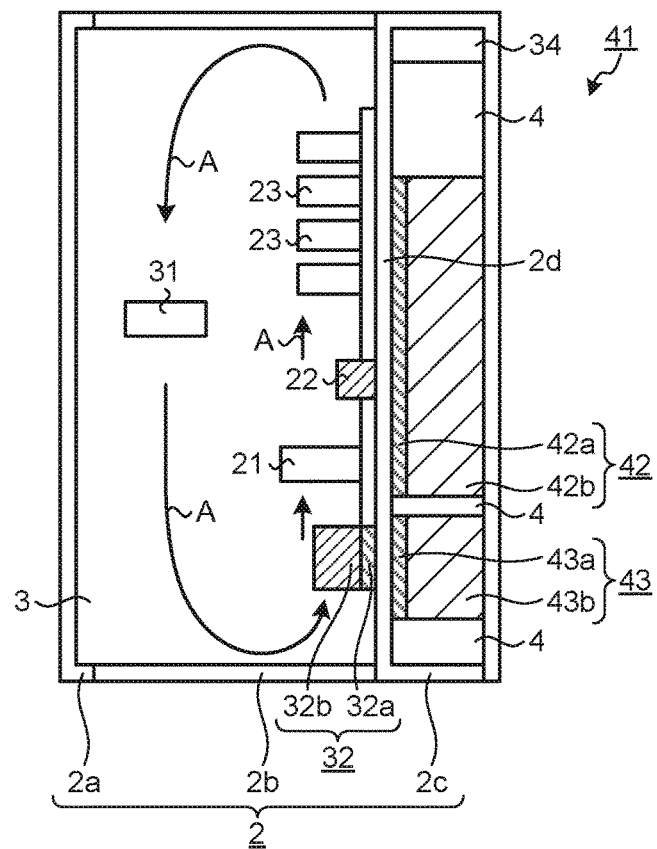
FIG. 5 is a side view of a power conversion apparatus according to a second embodiment of the present invention.

FIG. 5 is a side view of a power conversion apparatus 41 according to a second embodiment of the present invention. FIG. 5 provides an overview of main components seen through a side portion of the housing 2. It is noted that, in FIG. 5, the same members as the members of the power conversion apparatus 1 according to the first embodiment are denoted by the same reference numerals and signs. In FIG. 5, the internal air fan 31 circulates the internal air in the housing section 3 in the same direction A as shown in FIG. 2. The power conversion apparatus 41 according to the second embodiment differs from the power conversion apparatus 1 according to the first embodiment in that the external-side eat exchange section 33 is divided into a first external-side heat exchange section 42 for cooling the power module 22 and a second external-side heat exchange section 43 for cooling the internal air in the housing section 3. The first external-side heat exchange section 42 is an external-side heat exchange section for high-heat generating components. The external-side heat exchange section for high-heat generating components are provided for heating the power module 22, which is a high-heat generating component having the largest amount of heat during the operation among a plurality of heat generating components accommodated in the housing section 3. In the external-side heat exchange section 33, the first external-side heat exchange section 42 and the second external-side heat exchange section 43 are integrated together.

Similarly to the external-side heat exchange section 33, the first external-side heat exchange section 42 is configured from a base plate 42a and external fins 42b. The first external-side heat exchange section 42 is thermally connected to the power module 22. Similarly to the external-side heat exchange section 33, the second external-side heat exchange section 43 is configured from a base plate 43a and external fins 43b. The second external-side heat exchange section 43 is thermally connected to the internal-side heat exchange section 32. The second external-side heat exchange section 43 is not thermally connected to the power module 22. This enables heat to be efficiently radiated from the second external-side heat exchange section 43 into the internal air in the heat radiating section 4 without being affected by an amount of heat transferred from the power module 22 into the first external-side heat exchange section 42 even when such an amount of heat is large. The first external-side heat exchange section 42 is not thermally connected to the internal-side heat exchange section 32. This enables heat to be efficiently radiated from the first external-side heat exchange section 42 into the internal air in the heat radiating section 4 without being affected by an amount of heat transferred from the internal-side heat exchange section 32 into the second external-side heat exchange section 43 even when such an amount of heat is large.

The position of the second external-side heat exchange section 43 in the height direction of the housing section 3 is desirably set on the upstream side of the first external-side heat exchange section 42 in a direction in which the external air fan 34 discharges the internal air in the heat radiating section 4. This enables heat conducted from the internal-side heat exchange section 32 to be efficiently radiated from the second external-side heat exchange section 43 without being affected by the high-temperature internal air in the heat radiating section 4 into which heat is radiated from the first external-side heat exchange section 42.

As explained above, according to the second embodiment, the external-side heat exchange section 33 is divided into the first external-side heat exchange section 42 for cooling the power module 22 and the second external-heat exchange section 43 for cooling the internal air in the housing section 3. The radiation of the heat conducted from the power module 22 into the internal air in the heat radiating section 4 and the radiation of the heat conducted from the internal-side heat exchange section 32 into the internal air in the heat radiating section 4 are independently performed. Therefore, even when the amount of heat conducted from the power module 22 into the first external-side heat exchange section 42 is large, the heat conducted from the internal-side heat exchange section 32 is efficiently radiated into the internal air in the heat radiating section 4 to thereby further reduce the temperature of the internal air in the housing section 3.

Third Embodiment.

Figure 6:
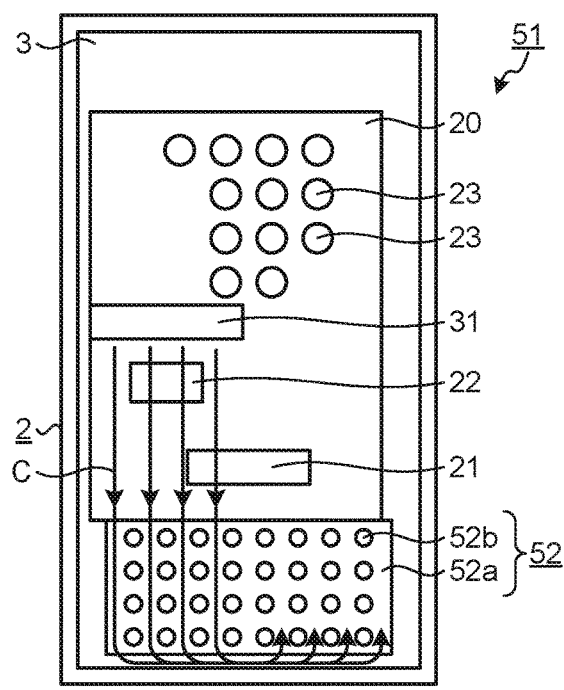
FIG. 6 is a schematic diagram illustrating a power conversion apparatus according to a third embodiment of the present invention.
Figure 7:
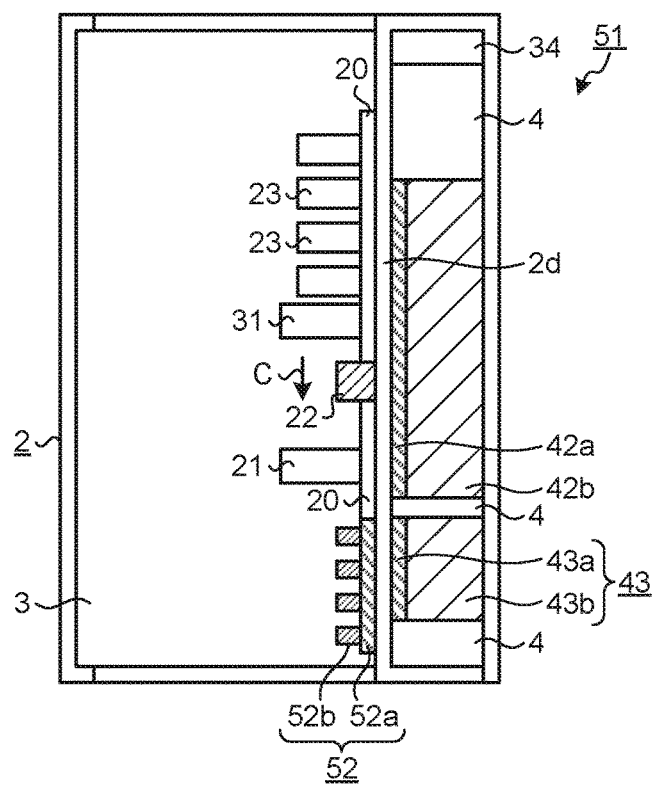
FIG. 7 is a side view of the power conversion apparatus according to the third embodiment of the present invention.

FIG. 6 is a schematic diagram illustrating a power conversion apparatus 51 according to a third embodiment of the present invention. In FIG. 6, the housing 2 in which electronic components configuring the power conversion apparatus 51 are accommodated is shown in front elevation. FIG. 6 provides an overview of main components seen through a front portion of the housing 2. FIG. 7 is a side view of the power conversion apparatus 51 according to the third embodiment of the present invention. FIG. 7 provides an overview of main components seen through a side portion configuring the housing 2. It is noted that, in FIG. 6 and FIG. 7, the same members as the members of the power conversion apparatus 41 according to the second embodiment are denoted by the same reference numerals and signs.

The power conversion apparatus 51 according to the third embodiment differs from the power conversion apparatus 41 according to the second embodiment in that the internal air fan 31 is disposed on the one wall 2d rather than the front surface section 2a side and the power module 22 is disposed below the internal air fan 31 on the left side when viewed from the front and in that the power conversion apparatus 51 includes an internal-side heat exchange section 52 including a heat exchange section configured from a plurality of columnar protrusions 52b arrayed at predefined intervals in a lattice shape on the principal plane of a base plate 52a. The height of the columnar protrusions 52b from the principal plane of the base plate 52a is much smaller than the height of the internal fins 32b from the principal plane of the base plate 32a in the second embodiment.

In FIG. 6 and FIG. 7, the internal air fan 31 circulates the internal air in the housing section 3 in a direction indicated by arrows C. When the internal air in the housing section 3 circulates in the direction indicated by the arrows C in FIG. 6 and FIG. 7, the high-temperature internal air rising in the housing section 3 can be delivered to the internal-side heat exchange section 52. Also, the high-temperature internal air into which heat is radiated from the power module 22 can be delivered to the internal-side heat exchange section 52. This facilitates heat absorption by the internal-side heat exchange section 52 from the internal air in the housing section 3.

Since the columnar protrusions 52*b* are arranged in the lattice shape in the direction of the plane in which the one wall 2*d* lies, when the internal air in the housing section 3 is circulated by the internal air fan 31, it is possible to keep the internal-side heat exchange section 52 from hindering the flow of the circulating internal air. Consequently, it is possible to suppress an air course loss at the time when the internal air circulating in the housing section 3 passes through the internal-side heat exchange section 52. Thus, it is possible to increase an amount of the circulating internal air and efficiently equalize the temperature of the internal air in the housing section 3. It is possible to deliver the internal air to the internal-side heat exchange section 52.

Since the height of the columnar protrusions 52*b* from the principal plane of the base plate 52*a* is set low, when the internal air in the housing section 3 is circulated by the internal air fan 31, it is possible to keep the internal-side heat exchange section 52 from hindering the flow of the circulating internal air. Consequently, it is possible to suppress the air course loss at the time when the internal air circulating in the housing section 3 passes through the internal-side heat exchange section 52. Thus, it is possible to increase an amount of the circulating internal air and efficiently equalize the temperature of the internal air in the housing section 3. It is possible to efficiently deliver the internal air to the internal-side heat exchange section 52. This enables the internal-side heat exchange section 52 to efficiently perform the heat absorption from the internal air in the housing section 3.

It is noted that the diameter and height of the columnar protrusions 52*b* may be set as appropriate according to the conditions such as a volume of the housing section 3, types and numbers of heat generating components accommodated in the housing section 3, the effect of suppressing the air course loss, an effect of reducing the internal temperature of the internal air in the housing section 3 by the exchange between the second external-side heat exchange section 43 and the internal-side heat exchange section 52, and an effect of reducing the temperatures of the heat generating components in the housing section 3.

As explained above, according to the third embodiment, it is possible to suppress the air course loss at the time when the internal air circulating in the housing section 3 passes through the internal-side heat exchange section 52, and thus increase the amount of the internal air circulating in the housing section 3. This enables the internal-side heat exchange section 52 to efficiently perform the heat absorption from the internal air in the housing section 3.

Fourth Embodiment.

Figure 8:
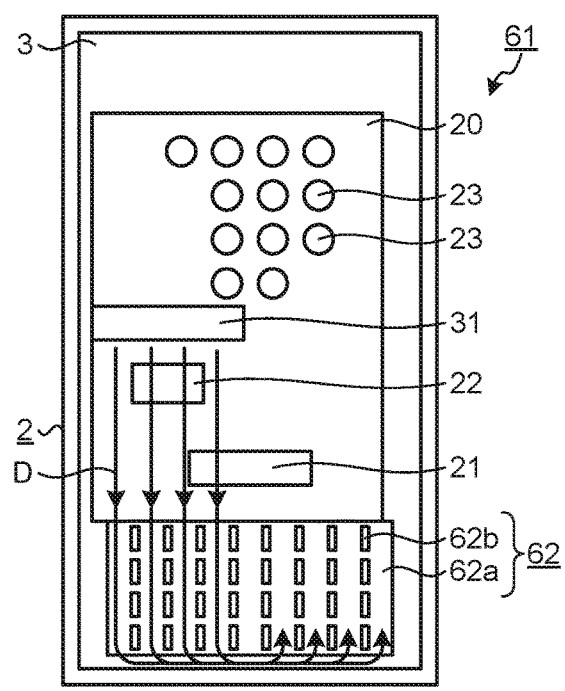
FIG. 8 is a schematic diagram illustrating a power conversion apparatus according to a fourth embodiment of the present invention.
Figure 9:
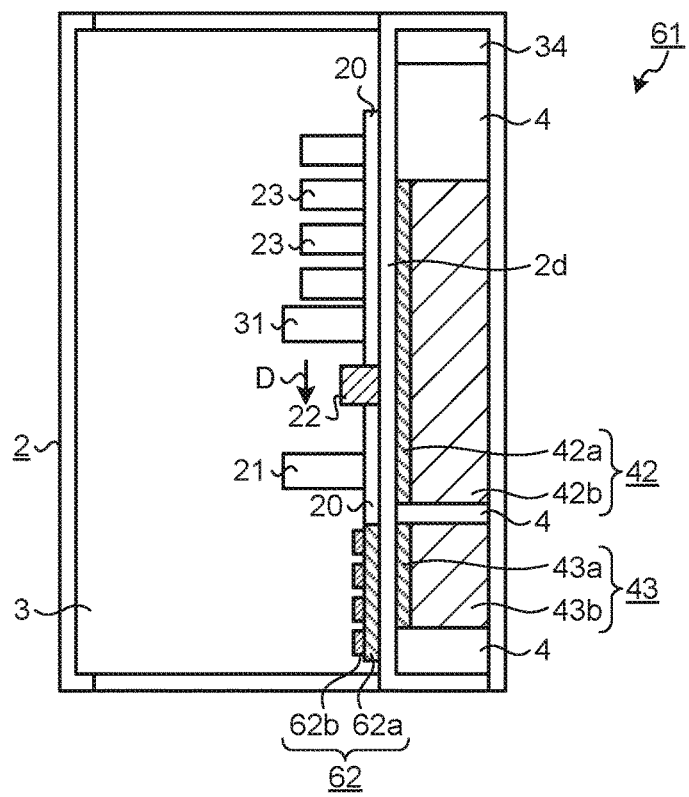
FIG. 9 is a side view of the power conversion apparatus according to the fourth embodiment of the present invention.

A modification of the power conversion apparatus 51 is explained. FIG. 8 is a schematic diagram illustrating a power conversion apparatus 61 according to a fourth embodiment of the present invention. In FIG. 8, the housing 2 in which electronic components configuring the power conversion apparatus 61 are accommodated is shown in front elevation. FIG. 8 provides an overview of main components seen through a front portion of the housing 2 FIG. 9 is a side view of the power conversion apparatus 61 according to the fourth embodiment of the present invention. FIG. 9 provides an overview of main components seen through a side portion configuring the housing 2. It is noted that, in FIG. 8 and FIG. 9, the same members as the members of the power conversion apparatus 41 according to the second embodiment are denoted by the same reference numerals and signs.

The power conversion apparatus 61 according to the fourth embodiment differs from the power conversion apparatus 51 according to the third embodiment in that the power conversion apparatus 61 includes, instead of the internal-side heat exchange section 52, an internal-side heat exchange section 62. The internal-side heat exchange section 62 includes elongated protrusions 62*b* that are arrayed at predefined intervals in a lattice shape on the principal plane of a base plate 62*a* and extend in a direction in which the internal air circulating in the housing section 3 flows into the internal-side heat exchange section. The height of the elongated protrusions 62*b* from the principal plane of the base plate 62*a* is much smaller than the height of the internal fins 32*b* from the principal plane of the base plate 32*a* in the second embodiment.

In FIG. 8 and FIG. 9, the internal air fan 31 circulates the internal air in the housing section 3 in a direction indicated by arrows D. The circulating direction of the internal air in the housing section 3 indicated by the arrows D is the same as the circulating direction of the internal air in the housing section 3 indicated by the arrows C in the third embodiment.

Since the shape of the protrusions is the elongated shape extending in the direction in which the internal air circulating in the housing section 3 flows into the internal-side heat exchange section, it is possible to suppress an air course loss at the time when the internal air circulating in the housing section 3 passes through the internal-side heat exchange section 62. It is also possible to guide the internal air having flowed into the internal-side heat exchange section 62 and thus suppress disturbance of the flowing direction of the internal air. Consequently, it is possible to further increase the amount of the internal air circulating in the housing section 3 and efficiently equalize the temperature of the internal air in the housing section 3. It is possible to efficiently deliver the internal air to the internal-side heat exchange section 62.

It is noted that the diameter and height of the protrusions may be set as appropriate according to the conditions such as a volume of the housing section 3, types and numbers of heat generating components accommodated in the housing section 3, the effect of suppressing the air course loss, an effect of reducing the internal temperature of the internal air in the housing section 3 by the exchange between the external-side heat exchange section and the internal-side heat exchange section, and an effect of reducing the temperatures of the heat generating components in the housing section 3.

As explained above, according to the fourth embodiment, since it is possible to suppress the air course loss at the time when the internal air circulating in the housing section 3 passes through the internal-side heat exchange section 62, and guide the internal air having flowed into the internal-side heat exchange section 62, the amount of the internal air circulating in the housing section 3 can increase. This enables the internal-side heat exchange section 62 to efficiently perform the heat absorption from the internal air in the housing section 3.

Fifth Embodiment.

Figure 10:
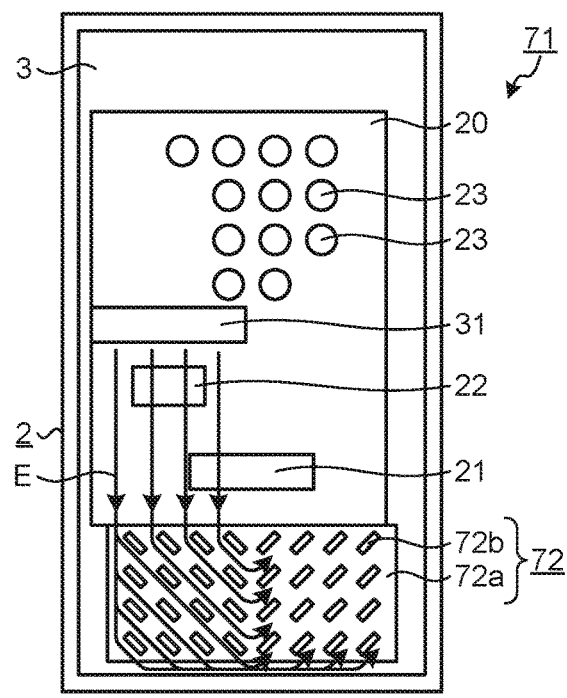
FIG. 10 is a schematic diagram illustrating a power conversion apparatus according to a fifth embodiment of the present invention.
Figure 11:
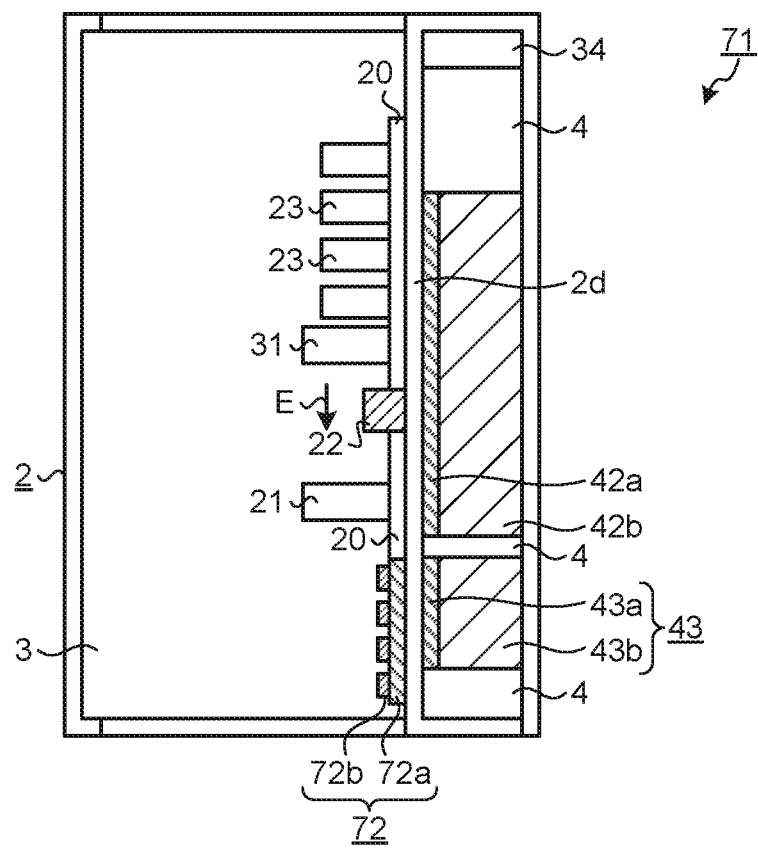
FIG. 11 is a side view of the power conversion apparatus according to the fifth embodiment of the present invention.

A modification of the power conversion apparatus 61 is explained. FIG. 10 is a schematic diagram illustrating a power conversion apparatus 71 according to a fifth embodiment of the present invention. In FIG. 10, the housing 2 in which electronic components configuring the power conversion apparatus 71 are accommodated is shown in front elevation. FIG. 10 provides an overview of main components seen through a front portion of the housing 2. FIG. 11 is a side view of the power conversion apparatus 71 according to the fifth embodiment of the present invention. FIG. 11 provides an overview of main components seen through a side portion configuring the housing 2. It is noted that, in FIG. 10 and FIG. 11, the same members as the members of the power conversion apparatus 41 according to the second embodiment are denoted by the same reference numerals and signs.

The power conversion apparatus 71 according to the fifth embodiment differs from the power conversion apparatus 61 according to the fourth embodiment in that the power conversion apparatus 71 includes, instead of the internal-side heat exchange section 62, an internal-side heat exchange section 72. The internal-side heat exchange section 72 includes elongated protrusions 72b that are arrayed at predefined intervals in a lattice shape on the principal plane of a base plate 72a and extend in such a direction that the internal air circulating in the housing section 3 flowing into the internal-side heat exchange section is guided in a predefined circulating direction. The elongated protrusions 72b, which are disposed to incline relative to the direction in which the internal air circulating in the housing section 3 flows into the internal-side heat exchange section, guides the internal air in the circulating direction. The height of the elongated protrusions 72b from the principal plane of the base plate 72a is much smaller than the height of the internal fins 32b from the principal plane of the base plate 32a in the second embodiment.

In FIG. 10 and FIG. 11, the internal air fan 31 circulates the internal air in the housing section 3 in a direction indicated by arrows E. Although the circulating direction of the internal air in the housing section 3 indicated by the arrows E is similar to the circulating direction of the internal air in the housing section 3 indicated by the arrows D in the fourth embodiment, the course of the air having entered the internal-side heat exchange section 72 is changed in such a manner that the air is guided by the lateral side surfaces of the elongated protrusions 72b before reaching the inner bottom surface of the housing section 3, and is then gently curved to return to the upper part the housing section 3.

Since the elongated protrusions are disposed to incline relative to the direction in which the internal air circulating in the housing section 3 flows into the internal-side heat exchange section 72, to guide the internal air in the circulating direction, the internal air having flowed into the internal-side heat exchange section 72 is guided by the gently curved course to return to the upper part the housing section 3. Therefore, it is possible to further suppress the air course loss at the time when the internal air circulating in the housing section 3 passes through the internal-side heat exchange section 72.

The configurations of the internal-side heat exchange sections in the second to fifth embodiments explained above can be applied to the power conversion apparatus 1 according to the first embodiment. In this case, as in the above explanation, it is possible to increase the amount of the internal air circulating in the housing section 3. This enables the internal-side heat exchange section to efficiently perform heat absorption from the internal air in the housing section 3.

As explained above, according to the fifth embodiment, since it is possible to suppress the air course loss at the time when the internal air circulating in the housing section 3 passes through the internal-side heat exchange section 72, and guide the internal air, having flowed into the internal-side heat exchange section 72, along the gently curved course, the amount of the internal air circulating in the housing section 3 can increase. This enables the internal-side heat exchange section 72 to more efficiently perform the heat absorption from the internal air in the housing section 3.

The configurations explained in the embodiments indicate examples of the content of the present invention. The configurations can be combined with other well-known technologies. The configurations can be partially omitted and changed without departing from the spirit of the present invention.

REFERENCE SIGNS LIST 1, 41, 51, 61, 71 power conversion apparatus, housing, 2a front surface section, 2b body section, 2c rear surface section, 2d one wall, 3 housing section, 4 heat radiating section, 11 power conversion circuit, 12 rectifier circuit, 13 smoothing circuit, 14 switching circuit, 15 DC reactor, 20 attachment plate, 21 coil, 22 power module, 23 capacitor, 31 internal air fan, 32, 52,62, 72 internal-side heat exchange section, 32a, 52a, 62a base plate, 32b internal fin, 33 external-side heat exchange section, 42 first external-side heat exchange section, 43 second external-side heat exchange section, 33a, 42a, 43a, 72a base plate, 33b, 42b, 43b external fin, 34 external air fan, 52b columnar protrusion, 62b elongated protrusion, 72b elongated protrusion.

The invention claimed is:
1. An electronic apparatus comprising:
a housing including a sealable housing section;
a plurality of heat generating components accommodated within the housing section;
an internal-side heat exchange section disposed in contact with one inner surface of one wall of the housing configuring the housing section, the one inner surface facing the housing section;
an external-side heat exchange section including:
a first external-side heat exchange section portion disposed in contact with one outer surface of the one wall in an opposed relationship with the internal-side heat exchange section, the one outer surface facing an outside of the housing section; and
a second external-side heat exchange section portion for heat exchange between the heat generating components and external air outside the housing section; and
an internal fan accommodated within the housing section, wherein
the heat generating components include a high-heat generating component disposed in contact with the one inner surface in an opposed relationship with the second external-side heat exchange section portion, the high-heat generating component generating a largest amount of heat among the heat generating components during an operation,
the internal fan circulates internal air in the housing section to deliver the internal air to the internal-side heat exchange section,
heat exchange between the high-heat generating component and the external air outside the housing section is effected through the second external-side heat exchange section portion, and
heat exchange between the internal air inside the housing section and the external air outside the housing section is effected through the internal-side heat exchange section and the first external-side heat exchange section portion.

2. The electronic apparatus according to claim 1, wherein the internal-side heat exchange section comprises a plurality of protrusions arrayed in a lattice shape on the one inner surface.

3. The electronic apparatus according to claim 2, wherein the protrusions have elongated shapes extending in a direction in which the internal air circulating in the housing section flows into the internal-side heat exchange section.

4. The electronic apparatus according to claim 2, wherein the protrusions have elongated shapes extending in a direction in which the internal air inside the housing section having flowed into the internal-side heat exchange section is guided in a predefined circulating direction.

5. The electronic apparatus according to claim 1, wherein the first external-side heat exchange section portion and the second external-side heat exchange section portion are integrated together.

6. The electronic apparatus according to claim 1, wherein
the first external-side heat exchange section portion and the second external-side heat exchange section portion are disposed within a heat radiating section defined by surfaces one of which is the one outer surface,
the heat radiating section includes an external air fan that discharges the external air inside the heat radiating section, and
a position of the internal-side heat exchange section in a height direction of the housing is set on an upstream side of the high-heat generating component in a direction in which the external air fan discharges the external air inside the heat radiating section.

7. The electronic apparatus according to claim 1, wherein the high-heat generating component includes a switching semiconductor element that converts DC power into AC power by performing a switching operation.

* * * * *